United States Patent [19]

Berkman et al.

[11] 4,271,129
[45] Jun. 2, 1981

[54] HEAT RADIATION DEFLECTORS WITHIN AN EFG CRUCIBLE

[75] Inventors: Samuel Berkman, Florham Park; Robert Metzl, Hamilton Square; Richard E. Novak, E. Windsor, all of N.J.; David L. Patterson, Mountaintop, Pa.

[73] Assignee: RCA Corporation, New York, N.Y.

[21] Appl. No.: 18,040

[22] Filed: Mar. 6, 1979

[51] Int. Cl.³ ............................................ C30B 35/00
[52] U.S. Cl. .................................................... 422/246
[58] Field of Search ......... 156/608, DIG. 73, 617 SP, 156/617 R, DIG. 88; 148/1.5, 172; 422/246

[56] References Cited

U.S. PATENT DOCUMENTS

| 3,002,824 | 10/1961 | Francois | 156/617 SP |
|---|---|---|---|
| 3,953,174 | 4/1976 | LaBelle | 156/608 |
| 4,028,059 | 6/1977 | LaBelle | 156/608 |
| 4,116,641 | 9/1978 | Ciszek | 156/608 |
| 4,184,907 | 1/1980 | Yates | 156/601 |
| 4,185,076 | 1/1980 | Hatch et al. | 422/246 |

FOREIGN PATENT DOCUMENTS

| 1319893 | 6/1973 | United Kingdom . |
|---|---|---|
| 1539125 | 1/1979 | United Kingdom . |
| 1539126 | 1/1979 | United Kingdom . |
| 1540037 | 2/1979 | United Kingdom . |

OTHER PUBLICATIONS

Final Technical Progress Report, "Sapphire Ribbon", Jun. 26, 1969–Jun. 26, 1971, Tyco Lab., Contract No. DAAB05-69-C-0021.

Primary Examiner—Hiram Bernstein
Attorney, Agent, or Firm—Birgit E. Morris; Donald S. Cohen; Robert P. Seitter

[57] ABSTRACT

The thermal profile at the top of an EFG die is improved by including heat radiation deflectors within the crucible to change the level of radiation heating experienced by at least some portions of the die.

7 Claims, 8 Drawing Figures

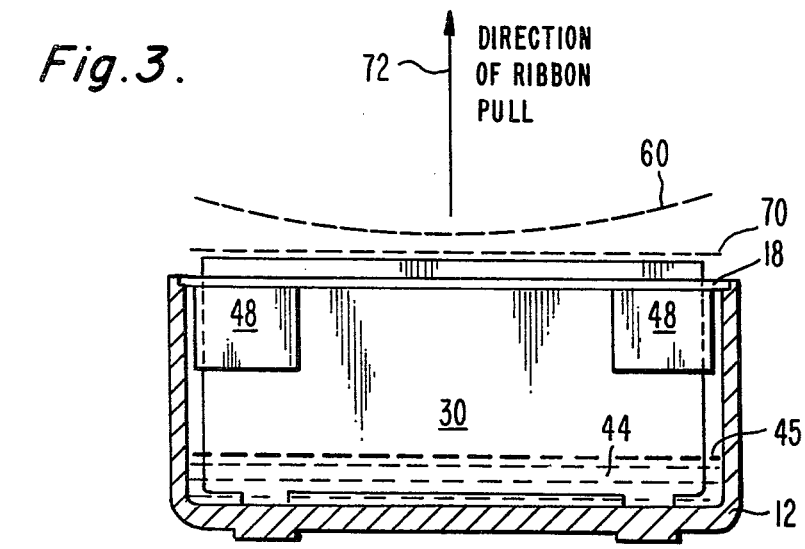
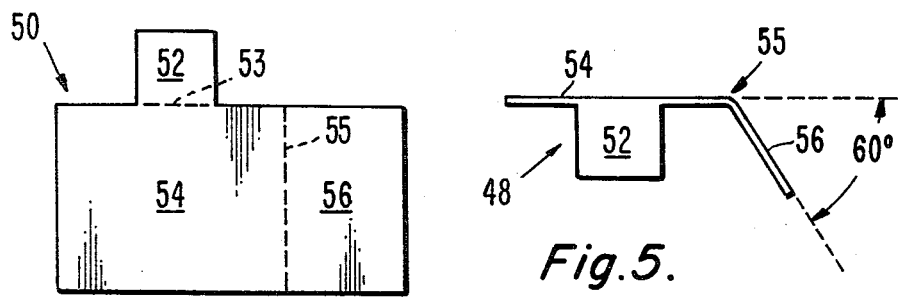
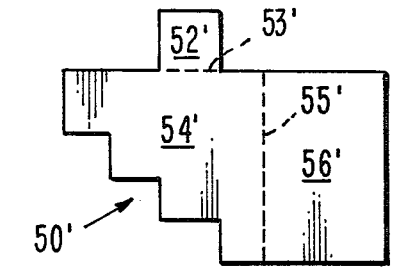
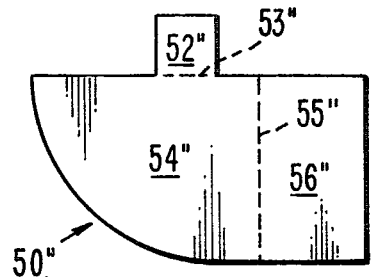
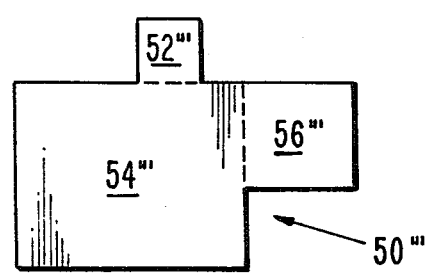

HEAT RADIATION DEFLECTORS WITHIN AN EFG CRUCIBLE

BACKGROUND OF THE INVENTION

1. Field of the Invention

The invention relates to the field of controlling or modifying the thermal profile in the vicinity of the growth control surfaces of an EFG die within an EFG furnace.

2. Prior Art

Prior art EFG (Edge-defined Film-fed Growth) furnaces have utilized crucible covers which cover the crucible except where the die extends through the cover. It is well-known to provide a stack of flat heat shields above the crucible cover. Spacers space these heat shields from each other and from the cover. The heat shield stack changes the thermal profile above the cover from what it would be in the absence of the heat shields. It is well-known in the art to vary the number and spacing of the heat shields in the stack in an attempt to control the thermal profile at the top of the die and the thermal gradient in the first few inches above the die (the region first traversed by the newly crystallized ribbon material). It is also known to vary the vertical alignment between the induction heating coil and the crucible. These techniques are used to provide proper crystallization conditions at the liquid-solid growth interface and to provide a thermal gradient for after-growth annealing of the ribbon material and to prevent excessive thermal gradients which could crack the newly grown crystal. Such heat shield systems have not been fully effective in controlling the thermal profile at the top of the die. Improved thermal profile control at the die top is needed in order to grow higher quality, relatively wide ribbons, especially when growing a plurality of ribbons from a single die.

SUMMARY OF THE INVENTION

The present invention improves the thermal profile along the growth control surfaces of EFG ribbon dies by providing heat radiation deflectors within the crucible which change the quantity of radiation impinging on at least some portion of the die and thus modify the thermal profile along the length of the growth control surfaces of the die.

BRIEF DESCRIPTION OF THE DRAWINGS

FIG. 3 is a side view of an EFG die in the crucible with the shape of a die top for a uniform die-top-temperature illustrated for crucibles with and without the in-the-crucible heat deflectors.

FIG. 4 is a plan view of a metal blank from which a preferred in-the-crucible heat deflector is fabricated.

FIG. 5 is a plan view of the preferred configuration for an in-the-crucible heat deflector after fabrication.

FIGS. 6, 7 and 8 illustrate blanks for three of the many possible alternative heat deflector configurations which may be used in accordance with desired modifications of the thermal conditions at the die top.

DETAILED DESCRIPTION OF THE PREFERRED EMBODIMENT

Figure 1:
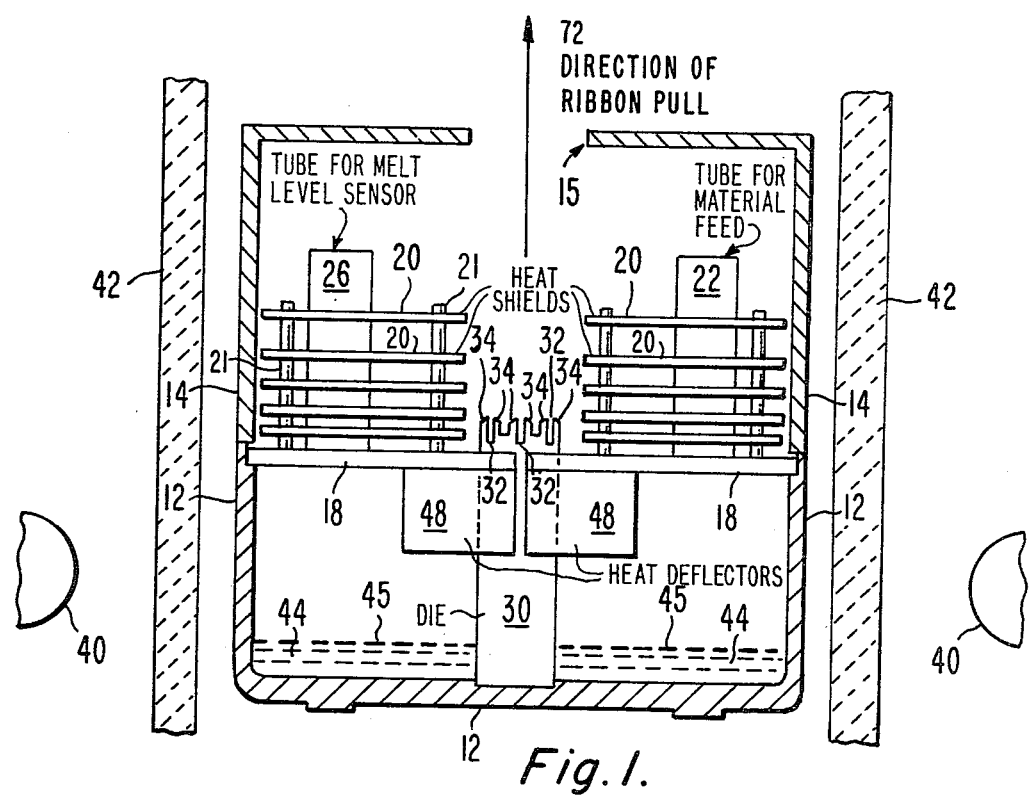
FIG. 1 illustrates a cut away, side, plan view of a crucible assembly which includes the in-the-crucible heat radiation deflectors of this invention.
Figure 2:
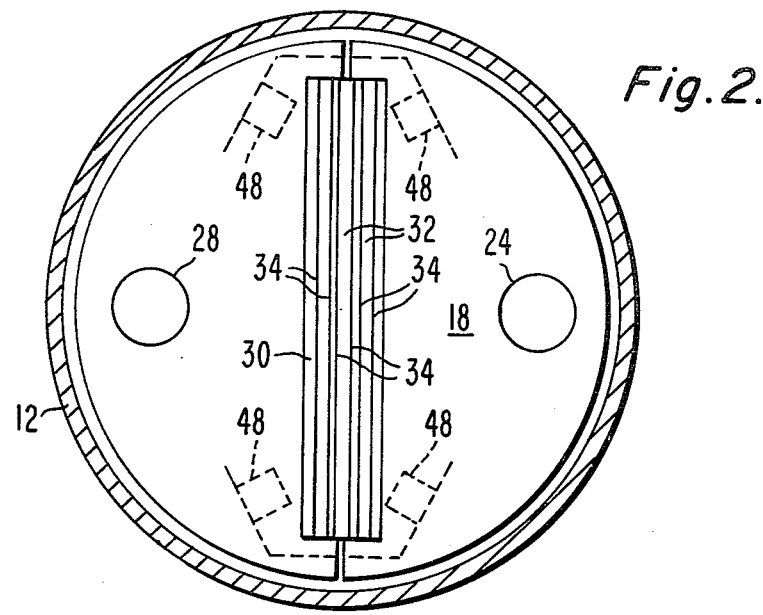
FIG. 2 is a plan view of an EFG crucible and the in-the-crucible heat deflectors in accordance with the present invention.

Referring to FIG. 1, a crucible assembly 10 comprises a crucible 12 and a cage 14 which in combination contain and enclose an EFG die 30, crucible cover plates 18 and two stacks of heat shields 20. The crucible assembly 10 is disposed within a cylindrical heat shield 42 and is heated by induction from an induction coil 40. FIG. 2 is a plan view of the top of the crucible with the cage 14 and the stacks of heat shields 20 removed. Most of the EFG die 30 is contained in the crucible 12 which is fitted with two half crucible cover plates 18 which, when in place, enclose the crucible and the major portion of the die which is below the cover plates. The cover plates 18 are also referred to collectively as a split lid 18. A separate stack of heat shields 20 is supported by each of the cover plates 18. Each of the individual heat shields 20 of the stack is spaced from each other and from the cover plate 18 by spacers 21.

A material feed tube 22 passes through one of the stacks of heat shields 20 in alignment with a hole 24 in a first one of the half cover plates 18. A tube 26 for a melt level sensor passes through the other stack of heat shields 20 in alignment with a hole 28 in the other half cover plate 18. The EFG die 30 illustrated is a three ribbon die having three capillaries 32. As illustrated, most of the die 30 lies below the cover plates 18 but the upper portions of the capillaries 32 extend above the cover plates 18 and the growth control surfaces 34 which are at the top of the capillaries 32 are also disposed above the cover plates 18. It is preferred for high quality growth and ease of control during crystal seeding and growth that the growth control surface 34 of the die 30 be at a uniform temperature. Other than the details of the die configuration, the portions of the crucible system described thus far are essentially in accordance with the prior art.

In an EFG crystal growth system, the pool of melt 44 in the bottom of the crucible 12 must be at a temperature which is higher than the crystallization temperature of the material being grown in order that newly introduced source material will melt and become part of melt 44. Further, the melt must be hot enough that it will not crystallize within the capillaries 32 of the die 30. The growth control surfaces 34 of the die 30 must be maintained very close to, but slightly above, the crystallization temperature of the material being grown since the material must crystallize at the far side of the liquid meniscus which connects the growing crystal to the crystal growth control surfaces 34.

Because of the need for these conditions, EFG furnaces are configured to maintain the area within the crucible 12 at a higher temperature than the area above the cover plates 18. Consequently, the die 30 is heated from within the crucible and is cooled, inter alia, by radiation into the space above the covers 18. A curved top die had to be used in the prior art in order to obtain long (longer than about 1½ inches) growth control surfaces which were at a uniform temperature. The shape of the growth control surface of such a die is illustrated by the dashed line 60 in FIG. 3. We have determined that the curved top was needed because the portions of the die which extended furthest from the cover plates 18 were being heated too much from within the crucible for the amount of cooling they achieved by radiation into the space above the crucible. The added height above the covers 18 of the extended portions of the die put those portions of the growth control surface in a cooler furnace zone and provided that portion of the die with a larger radiation surface. This increased radiation surface provided enough extra radiation cooling to dissipate the extra heat and thus to maintain the growth control surface at a substantially uniform temperature along its entire length.

The problem of providing the growth control surfaces of a flat top die with uniform temperatures has now been solved by providing heat deflectors 48 within the crucible 12 to reduce the heating of those portions of the die which in the prior art have been at too high a temperature to allow the use of flat top die growth control surfaces. Thus, a die for growing flat ribbon having its growth control surfaces 34 along the flat top of the die (as illustrated by the dashed line 70 in FIG. 3) can now have a substantially uniform temperature along the entire length of the growth control surface, whatever the length of that surface. This is a substantial advance, especially for ribbons 2½ or 3 inches wide or wider. Three inch and larger ribbons are especially useful for the fabrication of silicon on sapphire integrated circuits.

Where the main source of heat within a cylindrical crucible is its wall, then for otherwise constant thermal conditions, the ends of a straight die whose ends approach close to the crucible walls will be heated hotter by radiation from the walls than is the case for a die whose ends are further from the wall of the crucible. The temperature difference between the ends of such a die and its center will also be greater as a result of the greater quantity of radiation heat reaching the die ends which are closer to the wall whereas this difference in spacing has very little effect on the heating of the middle of the die.

In accordance with the preferred embodiment of the invention, two heat deflectors 48 are disposed at each end of the die within the crucible (below the crucible covers 18). These radiation deflectors may preferably be affixed to or supported by the cover plates 18. Some of the radiated heat which would otherwise reach the die ends directly from the adjacent portions of the crucible wall is reflected by heat deflectors 48 which thereby reduce the quantity of radiated heat received by the end portions of the die. This reduces the temperature of the die ends. The heat deflectors 48 preferably extend only part way down toward the surface 45 of the melt 44, since in this preferred embodiment deflector contact with the melt would have at least two detrimental effects. First, such contact would heat the deflectors by conduction and tend to make them radiation sources themselves. Second, for the deflector placement illustrated, such contact would wick the melt 44 part way up the narrow space between the heat deflectors 48 and the wall of the crucible 12.

The term heat or radiation deflectors is intended to include heat shields, heat reflectors and other structures which deflect heat from the path it would otherwise take in their absence. This deflection of radiation may be achieved either by changing the radiation's direction of motion or by restricting its motion along its path, or both. The heat deflectors 48 in the present embodiment function primarily by reflecting radiated heat. The heat deflectors 48 could also be referred to as heat shields, since they shield the end portions of the die from at least some of the heat radiated from the adjacent portions of the crucible wall.

The deflectors 48 are preferably disposed parallel to the vertical, but may be disposed at an angle to the vertical if that provides the desired thermal changes. The deflectors 48 may be shaped and arranged to increase the radiative heating of a particular section of the die, such as a relatively cooler portion of the die, by concentrating radiated heat thereon. It may also be desirable to allow contact between the deflectors 48 and the melt 44 in some circumstances, such as where increased heating of the die is desired.

At the present time it is preferred to utilize the deflectors in the configuration and in the locations illustrated in FIGS. 1 and 2 in which they decrease the heating of the relatively hot end portions of the die. In order to simultaneously obtain both the desired thermal profile along the top of the die and the desired thermal gradient in the direction 72 of ribbon pull, simultaneous use of deflectors 48 and stacks of heat shields 20 above the cover plates 18 is preferred.

FIG. 4 illustrates a starting blank 50 for forming a preferred heat deflector 48 in accordance with the invention. Blank 50 comprises a flat sheet of appropriate material such as molybdenum and has a rectangular tab 52 extending from one side of a larger rectangle 54, 56. Tab 52 is bent along the dashed line 53 where it is joined to the rectangle 54, 56 to form a right angle with the rectangle 54, 56. The rectangle 54, 56 is bent along the dashed line 55 to form a main plate 54 and an angle plate 56 angled at about 60 degrees to the main plate as shown in FIG. 5. The tab 52 is preferably used to affix the deflector to a cover plate 18.

For use in a 3.50 inch (8.89 cm) inner diameter crucible for growing 3 inch ribbons, it is preferred to have the tab 52⅛ inch (0.3175 cm) square, the main plate ¾ inch (1.905 cm) long by ⅝ inch (1.5875 cm) deep and the angle plate ⅜ inch (0.9525 cm) long by ⅝ inch (1.5875 cm) deep. This configuration, when installed as illustrated, shields about ½ inch (1.27 cm) at each end of the 3 inch (7.62 cm) long die or about 1/6 of its total length from each end.

The locations of the heat deflectors 48 are illustrated in phantom in FIG. 2 because they lie below the cover half plates 18. Both lefthanded and righthanded versions of the in-the-crucible heat deflectors 48 are used in fabricating the preferred heat deflector structure.

This invention made feasible the original use of and is a substantial aid in the use of flat top dies for growing wide flat ribbons. However, it is not restricted to such use. With the described in-the-crucible heat deflectors, it has become possible to grow 5 three-inch-wide single crystalline sapphire ribbons simultaneously from a 5 capillary flat-top die disposed within a 3.50 inch (8.89 cm) inner diameter crucible 12. Such facilitation of multiple ribbon growth substantially reduces the capital cost which must be invested per lineal foot of ribbon grown per unit time. This growth also confirms the stable nature of the substantially planar isotherm which results from the use of these deflectors.

The degree to which and the manner in which it is desirable to modify the thermal conditions in a furnace depends on the particular characteristics of and the objective of the EFG system being modified. The size, configuration, location and number of the in-the-crucible heat deflectors should be selected in accordance with the changes desired in the pre-existing thermal conditions in the furnace.

The shape of the deflectors 48 may be varied in many ways to tailor the radiative heating. Thus, deflectors having stepped, sloped, curved or other shaped sections may be used if that is advantageous. Similarly, deflectors without bends or with multiple bends or curves may be utilized. Several of the virtually limitless possible variations are illustrated in FIGS. 6, 7 and 8.

A deflector blank 50' illustrated in FIG. 6 has a stepped lower edge on the main section 54'. A deflector blank 50" illustrated in FIG. 7 has a curved lower edge to its main section 54". A deflector blank 50''' illustrated in FIG. 8 has an angle portion 56''' which is not as deep as its main portion 54'''. A lesser depth to the angle portion 56''' may be desirable where the end portion of the die is aligned with a viewing port in the heat shield 42 which surrounds the crucible. Such a viewing port tends to result in a cooler portion at the very end of the die.

The in-the-crucible heat deflectors 48 make it possible to tailor the thermal profile of the furnace at the die top to the desired contour of the die (preferably a flat top). Thus, the user fabricates the die top in the configuration he considers preferable and then tailors the furnace thermal profile to match that growth control surface. This is a major improvement over the prior art technique of tailoring the die top to the existing furnace profile.

A flat top die is one in which each growth control surface lies along a different line which is parallel to the plane of the surface 45 of the melt 44 in the crucible. A flat top die may have any desired cross-sectional configuration, since that configuration of the die is dependent on characteristics of the material being grown as well as the shape desired for the grown crystal.

A heat deflector structure for EFG growth has been illustrated and described. The preferred embodiment may be varied in many ways such as deflector shape, size, location, number and so on without departing from the scope of the invention as defined in the appended claims.

What is claimed is:

1. In an EFG crystal growth crucible assembly having an EFG die structure disposed at least partially within the crucible, the improvement comprising:

radiation deflecting means disposed within said crucible;

said radiation deflecting means positioned to deflect from its path in the absence of said deflecting means at least some of the radiation within the crucible in order to change the quantity of radiation impinging on at least some portion of the die in order to control the relative intensity of the radiation heating received by different portions of the die as an aid in the establishment of a desired thermal profile in the vicinity of the growth surface of the die.

2. The improvement recited in claim 1 wherein said radiation deflecting means is disposed between the crucible wall and the portion of the die closest to the wall in order to reduce the quantity of radiatively induced heating of that portion of the die.

3. The improvement recited in claim 1 wherein said radiation deflecting means has a major surface substantially perpendicular to the surface of the melt within the crucible.

4. The improvement recited in claim 1, 2 or 3 wherein said radiation deflecting means is disposed out of contact with the pool of melt within the crucible.

5. The improvement recited in claim 1 wherein said radiation deflecting means constitutes a plate of radiation deflecting material disposed between the crucible wall and the portion of the die it is desired to maintain at a cooler temperature than that at which it would be maintained in the absence of said radiation deflecting means.

6. The improvement recited in claim 1 wherein said crucible assembly includes:

a crucible cover disposed to substantially enclose the crucible and a lower portion of the die; and said radiation deflecting means is supported by said crucible cover.

7. The improvement recited in claim 2 wherein said die is X units of length long and said radiation deflecting means is disposed to substantially shield about X/6 units of length of the die at each end of the die.

* * * * *